(12) United States Patent
Shirochi et al.

(10) Patent No.: US 11,433,459 B2
(45) Date of Patent: Sep. 6, 2022

(54) COATED CUTTING TOOL

(71) Applicant: TUNGALOY CORPORATION, Fukushima (JP)

(72) Inventors: Tsukasa Shirochi, Iwaki (JP); Naoyuki Fukushima, Iwaki (JP)

(73) Assignee: TUNGALOY CORPORATION, Fukushima (JP)

( * ) Notice: Subject to any disclaimer, the term of this patent is extended or adjusted under 35 U.S.C. 154(b) by 0 days.

(21) Appl. No.: 17/126,694

(22) Filed: Dec. 18, 2020

(65) Prior Publication Data

US 2021/0299758 A1 Sep. 30, 2021

(30) Foreign Application Priority Data

Mar. 31, 2020 (JP) .............................. JP2020-062826

(51) Int. Cl.
*B23B 27/14* (2006.01)
*C23C 16/30* (2006.01)
*B23C 5/16* (2006.01)
*C23C 16/34* (2006.01)

(52) U.S. Cl.
CPC .............. *B23B 27/148* (2013.01); *B23C 5/16* (2013.01); *C23C 16/303* (2013.01); *C23C 16/34* (2013.01); *B23B 2224/24* (2013.01); *B23B 2228/10* (2013.01); *B23B 2228/105* (2013.01); *B23C 2228/10* (2013.01)

(58) Field of Classification Search
CPC ... B23B 27/14; B23B 27/148; B23B 2224/24; B23B 2228/10; B23B 2228/105; B23C 5/16; C23C 16/34
USPC ......................................... 428/697, 698, 699
See application file for complete search history.

(56) References Cited

U.S. PATENT DOCUMENTS

2019/0010606 A1* 1/2019 Kubo ................... C23C 28/042

FOREIGN PATENT DOCUMENTS

JP        2019010707      *  1/2019
JP        2019-155570 A      9/2019

* cited by examiner

*Primary Examiner* — Archene A Turner
(74) *Attorney, Agent, or Firm* — Studebaker & Brackett PC

(57) ABSTRACT

A covered cutting tool having a cemented carbide and a covering layer formed on the cemented carbide. The covered cutting tool includes a rake face, a flank face, and a cutting edge line part located between the rake face and the flank face. The coating layer includes a compound layer containing a compound having a composition represented by $(Al_xTi_{1-x})N$. The average thickness $T_1$ of the covering layer in the cutting edge line part and the average thickness $T_2$ of the coating layer in the rake face at a position 2 mm or more away from the cutting edge line part toward the rake face are within specific ranges and satisfy $T_2<T_1$. The residual stress $S_1$ of the cemented carbide in the cutting edge line part and the residual stress $S_2$ of the cemented carbide in the rake face at a position 2 mm or more away from the cutting edge line part toward the rake face satisfy $S_2<S_1$.

5 Claims, 3 Drawing Sheets

COATED CUTTING TOOL

TECHNICAL FIELD

The present invention relates to a coated cutting tool.

BACKGROUND ART

Conventionally, it is well known that a coated cutting tool, which has a coating layer deposited on the surface of a cemented carbide substrate by a chemical vapor deposition method to a total thickness of 3 to 20 μm, is used for the cutting processing of steel, cast iron, or the like. As the coating layer described above, for example, a coating layer composed of a single layer or two or more layers selected from the group consisting of Ti carbides, nitrides, carbonitrides, oxycarbides, oxycarbonitrides, and aluminum oxide ($Al_2O_3$).

In addition, a coated tool having a Ti—Al-based nitride layer deposited by a physical vapor deposition method on the surface of a substrate made of a cemented carbide or a cubic boron nitride sintered compact is known, and such tools are known to exert excellent wear resistance. However, although the conventional coated tool described above, which has a Ti—Al-based nitride layer formed by a physical vapor deposition method, has relatively excellent wear resistance, in the case where such a tool is used under cutting conditions where the processing is at high speed, and the tool is intermittently loaded, cracking is likely to occur. Thus, for the improvement of a coating layer, various proposals have been made.

For example, PTL 1 describes a surface-coated cutting tool having a hard coating layer including at least two layers, an upper layer (α) and a lower layer (β), formed on the surface of a tool base composed of a WC-based cemented carbide, a TiCN-based cermet, or a cBN-based ultrahigh-pressure sintered compact. The surface-coated cutting tool is characterized in that (a) the upper layer α) is formed of an $Al_2O_3$ layer having an α-type crystal structure, (b) the lower layer (β) is formed of a Ti—Al composite nitride or composite carbonitride layer, (c) the Ti—Al composite nitride or composite carbonitride layer includes at least a crystal layer having a NaCl-type face-centered cubic structure, (d) when the thickness of the upper layer (α) in the cutting edge line is expressed as $T\alpha_1$, and the thickness at a point 500 μm away from the cutting edge line toward the rake face is expressed as $T\alpha_2$, $T\alpha_1$ and $T\alpha_2$ satisfy 0.0 to 5.0 μm and 1.0 to 20.0 μm, respectively, and also satisfy $T\alpha_1 < T\alpha_2$, and (e) when the thickness of the lower layer (β) in the cutting edge line is expressed as $T\beta_1$, and the thickness at a point 500 μm away from the cutting edge line toward the rake face is expressed as $T\beta_2$, $T\beta_1$ and $T\beta_2$ each satisfy 1.0 to 20.0 μm and also satisfy $T\beta_2 < T\beta_1$.

CITATION LIST

Patent Literature

Patent Document 1: JP-A-2019-155570

SUMMARY OF INVENTION

Technical Problem

In the recent cutting processing, higher speed, higher feed, and deeper cut have become more prominent, and tools are required to have improved wear resistance and fracture resistance than before. In addition, due to the complication of the processing shape, as compared with before, processing where the tool is intermittently loaded is increasingly performed. Under such severe cutting conditions, fracture due to thermal cracking may occur in conventional tools.

A coating layer formed by a chemical deposition method usually has excellent throwing power, and the thickness thereof is substantially the same from the cutting edge line part to around the hole in the center of the insert. In addition, in the case where a Ti—Al-based nitride layer is formed by a chemical deposition method, because the formation temperature is low, the compression stress of the substrate made of a cemented carbide tends to decrease. This is because in the case where a Ti—Al-based nitride layer is formed at a low temperature, the difference in the degree of thermal expansion between the coating layer and the cemented carbide substrate decreases, and the compression stress of the cemented carbide substrate decreases. As a result, in the obtained coated cutting tool, it tends to happen that the strength of the insert decreases, and the fracture resistance decreases. As a countermeasure against such a tendency, for example, a decrease in the strength of the insert has been suppressed by a treatment such as dry blasting or wet blasting. However, even when a treatment such as dry blasting or wet blasting is simply performed, under the above cutting conditions, it may happen that, for example, thermal cracking occurs at the corner of the insert used in processing, and such cracks propagate even to unused corners, resulting in the fracture of the insert. As a result, it may become impossible to use unused corners for cutting. In addition, the occurrence of thermal cracking in the early stage of processing may result in fracture. This triggers a difficulty in prolonging the tool life of the coated cutting tool. This is presumably due to the influence of the thickness of the coating layer and the residual stress of the substrate.

The surface-coated cutting tool described in PTL 1 is characterized in that when the thickness of the lower layer (β) in the cutting edge line is expressed as $T\beta_1$, and the thickness at a point 500 μm away from the cutting edge line toward the rake face is expressed as $T\beta_2$, $T\beta_1$ and $T\beta_2$ satisfy 1.0 to 20.0 μm and also satisfy $T\beta_2 < T\beta_1$. Such a surface-coated cutting tool can be expected to be effective in improving wear resistance. However, although the surface-coated cutting tool described in PTL 1 has excellent heat insulation because the upper layer (α) is an $Al_2O_3$ layer having an α-type crystal structure, in the case where fracture occurs, how heat is transferred to the substrate differs between a part where the $Al_2O_3$ layer remains and a part where the layer has been lost. Accordingly, thermal cracking may occur, making it impossible to prolong the tool life. In addition, PTL 1 does not disclose the effect of controlling the residual stress of a cemented carbide relative to each of the cutting edge line part and the rake face. In addition, in the method for producing a surface-coated cutting tool described in PTL 1, a coating layer is deposited and then subjected to a wet blasting treatment. However, it may be difficult to impart compression stress to a substrate through a wet blasting treatment. This is presumably due to the influence of the small size of the projection material.

The invention has been accomplished against the above background, and an object thereof is to provide a coated cutting tool having excellent fracture resistance and thus allowing for the extension of tool life.

Solution to Problem

The present inventors have conducted studies on the extension of the tool life of a coated cutting tool. As a result, they have found the following and thus accomplished the invention. That is, when a coated cutting tool is provided with a specific configuration, for example, even under cutting conditions where the tool is intermittently loaded, the occurrence of thermal cracking is suppressed, whereby the fracture resistance can be improved. As a result, the tool life of the coated cutting tools can be extended.

That is, the invention is as follows.

[1]

A coated cutting tool having a cemented carbide and a coating layer formed on the cemented carbide, the coated cutting tool being configured such that the coated cutting tool includes a rake face, a flank face, and a cutting edge line part located between the rake face and the flank face, the coating layer includes a compound layer containing a compound having a composition represented by the following formula (1):

$$(Al_xTi_{1-x})N \tag{1}$$

(in formula (1), x represents the atomic ratio of elemental Al relative to the total of elemental Al and elemental Ti and satisfies 0.70≤x≤0.90), when the average thickness of the coating layer in the cutting edge line part is expressed as $T_1$, and the average thickness of the coating layer in the rake face at a position 2 mm or more away from the cutting edge line part toward the rake face is expressed as $T_2$, $T_1$ is 4.0 μm or more and 10.0 μm or less, $T_2$ is 2.0 μm or more and 7.0 μm or less, and $T_2<T_1$ is satisfied, and when the residual stress of the cemented carbide in the cutting edge line part is expressed as $S_1$, and the residual stress of the cemented carbide in the rake face at a position 2 mm or more away from the cutting edge line part toward the rake face is expressed as $S_2$, $S_2<S_1$ is satisfied.

[2]

The coated cutting tool according to [1], wherein the residual stress $S_1$ is −0.5 GPa or more and 0.0 GPa or less, and the residual stress $S_2$ is −2.0 GPa or more and −0.3 GPa or less.

[3]

The coated cutting tool according to [1] or [2], wherein the difference $T_1-T_2$ between the average thickness $T_1$ and the average thickness $T_2$ is 1.0 μm or more and 4.0 μm or less.

[4]

The coated cutting tool according to any one of [1] to [3], wherein in the cemented carbide, the proportion of measurement points where tungsten carbide (WC) has a KAM value of 1° or less is 90% or more and 98% or less.

[5]

The coated cutting tool according to any one of [1] to [4], wherein the cemented carbide is based on a WC phase, contains Co in a proportion of 5.0 mass % or more and 15.0 mass % or less, and contains Cr in a proportion of, as $Cr_3C_2$, 0.3 mass % or more and 1.0 mass % or less.

The coated cutting tool according to any one of [1] to [5], wherein the coating layer includes, between the cemented carbide and the compound layer, a lower layer containing a Ti compound including elemental Ti and at least one element selected from the group consisting of C, N, O, and B.

Advantageous Effects of Invention

The coated cutting tool of the invention has excellent fracture resistance and thus allows for the extension of tool life.

DESCRIPTION OF EMBODIMENTS

Figure 1:
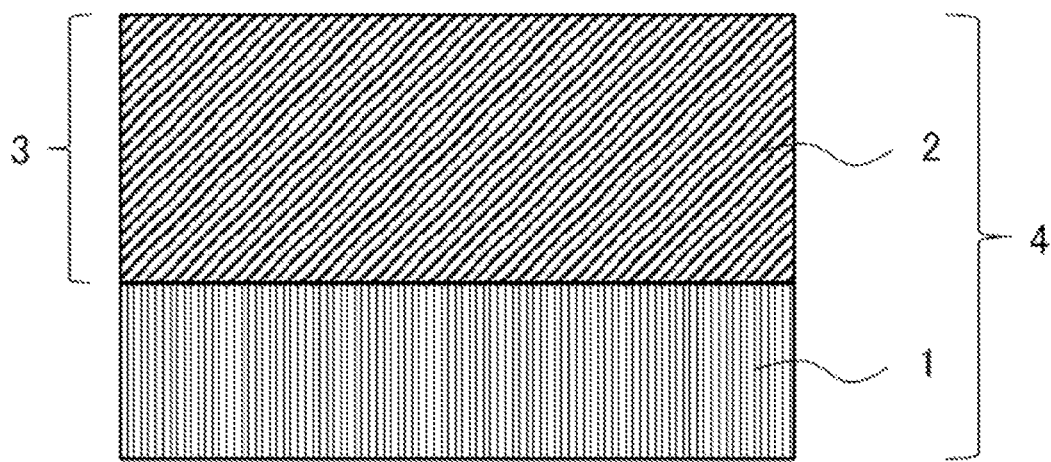
FIG. 1 A schematic cross-sectional view showing an example of the coated cutting tool of the invention.

Hereinafter, a mode for carrying out the invention (hereinafter simply referred to as "this embodiment") will be described in detail with reference to the drawings if necessary. However, the invention is not limited to this embodiment described below. Without deviating from the gist of the invention, various modifications can be made thereto. Incidentally, in the drawings, unless otherwise noted, the positional relationships, such as up, down, right, and left, are based on the positional relationships shown in the drawings. Further, the dimensional ratios in the drawings are not limited to the illustrated ratios.

The coated cutting tool of this embodiment has a cemented carbide and a coating layer formed on the cemented carbide, and includes a rake face, a flank face, and a cutting edge line part located between the rake face and the flank face. The coating layer includes a compound layer containing a compound having a composition represented by the following formula (1):

$$(Al_xTi_{1-x})N \tag{1}$$

(in formula (1), x represents the atomic ratio of elemental Al relative to the total of elemental Al and elemental Ti and satisfies 0.70≤x≤0.90).

When the average thickness of the coating layer in the cutting edge line part is expressed as $T_1$, and the average thickness of the coating layer in the rake face at a position 2 mm or more away from the cutting edge line part toward the rake face is expressed as $T_2$, $T_1$ is 4.0 μm or more and 10.0 μm or less, $T_2$ is 2.0 μm or more and 7.0 μm or less, and $T_2<T_1$ is satisfied, and when the residual stress of the cemented carbide in the cutting edge line part is expressed as $S_1$, and the residual stress of the cemented carbide in the rake face at a position 2 mm or more away from the cutting edge line part toward the rake face is expressed as $S_2$, $S_2<S_1$ is satisfied.

Because the coated cutting tool of this embodiment has the above configuration, for example, even under cutting processing conditions where the tool is intermittently highly loaded, the occurrence of thermal cracking can be suppressed. Accordingly, in the coated cutting tool of this embodiment, the fracture resistance can be improved, and also the fracture of unused corners can be suppressed. As a result, the tool life can be extended, and the reliability of the coated cutting tool can be enhanced. In the coated cutting tool of this embodiment, the factor that makes it possible to improve the fracture resistance and also suppress the fracture of unused corners is presumably as follows. However, the invention is not limited by the following factor in any way. That is, first, in the coated cutting tool of this embodiment, in the compound layer containing a compound having a composition represented by the above formula (1), when the atomic ratio x of elemental Al in the above formula (1) is 0.70 or more, the hardness improves due to solid solution hardening, resulting in improved wear resistance. In addition, with an increase in the Al content, the oxidation resistance improves. As a result, in the coated cutting tool of this embodiment, the crater wear resistance improves, whereby a decrease in the strength of the cutting edge can be suppressed, and the fracture resistance improves. In addition, in the coated cutting tool of this embodiment, in the compound layer containing a compound having a composition represented by the above formula (1), when the atomic ratio x of elemental Al in the above formula (1) is 0.90 or less, Ti is contained. As a result, the toughness improves, whereby the occurrence of thermal cracking can be suppressed, and the fracture resistance improves.

In addition, in the coated cutting tool of this embodiment, when the average thickness $T_1$ of the coating layer in the cutting edge line part is 4.0 μm or more, the wear resistance improves, while when $T_1$ is 10.0 μm or less, the adhesion to the cemented carbide improves, whereby the occurrence of thermal cracking can be suppressed, and the fracture resistance improves.

In addition, in the coated cutting tool of this embodiment, when the average thickness $T_2$ of the coating layer in the rake face at a position 2 mm or more away from the cutting edge line part toward the rake face is 2.0 μm or more, abnormal damage due to scratching by chips can be prevented, while when $T_2$ is 7.0 μm or less, through a treatment after the formation of the coating layer (e.g., dry blasting, shot peening), a residual stress can be effectively imparted to the cemented carbide.

Further, in the coated cutting tool of this embodiment, when the average thickness $T_1$ of the coating layer in the cutting edge line part is greater than the average thickness $T_2$ of the coating layer in the rake face at a position 2 mm or more away from the cutting edge line part toward the rake face, that is, when $T_2 < T_1$ is satisfied, the wear resistance improves, and also the occurrence of thermal cracking can be suppressed. Accordingly, the occurrence of fracture that will reach other corners can be suppressed.

Yet further, in the coated cutting tool of this embodiment, when the residual stress Sz of the cemented carbide in the rake face at a position 2 mm or more away from the cutting edge line part toward the rake face is lower than the residual stress $S_1$ of the cemented carbide in the cutting edge line part, that is, when $S_2 < S_1$ is satisfied, a suppressing effect is created on the propagation of cracks formed in the cutting edge line part into the interior of the coated cutting tool during cutting processing. Accordingly, the occurrence of thermal cracking can be suppressed, and the fracture resistance improves. This is presumably because the value of the residual stress $S_2$ of the cemented carbide in the rake face at a position 2 mm or more away from the cutting edge line part toward the rake face is on a compression stress side from the residual stress $S_1$ of the cemented carbide in the cutting edge line part.

Then, presumably, as a result of combining these configurations, in the coated cutting tool of this embodiment, the fracture resistance improves, and also the fracture of unused corners can be suppressed, making it possible to extend the tool life.

FIG. 1 is a schematic cross-sectional view showing an example of the coated cutting tool of this embodiment. A coated cutting tool 4 includes a cemented carbide 1 and a compound layer 2 (coating layer 3) formed on the surface of the cemented carbide 1.

The coated cutting tool of this embodiment includes a cemented carbide and a coating layer formed on the cemented carbide. As specific types of coated cutting tools, replaceable cutting inserts for milling or turning, drills, and end mills can be mentioned.

The cemented carbide for use in this embodiment may have its surface modified. For example, a de-β layer may be formed on the surface of the cemented carbide. Even when the cemented carbide has such a modified surface, the operation effect of the invention is produced.

<Coating Layer>

The coating layer for use in this embodiment includes a compound layer containing a compound having a composition represented by the following formula (1):

$$(Al_xTi_{1-x})N \quad (1)$$

(in formula (1), x represents the atomic ratio of elemental Al relative to the total of elemental Al and elemental Ti and satisfies 0.70≤x≤0.90).

In the coated cutting tool of this embodiment, in the compound layer containing a compound having a composition represented by the above formula (1), when x in the above formula (1) is 0.70 or more, the hardness improves due to solid solution hardening, resulting in improved wear resistance. In addition, with an increase in the Al content, the oxidation resistance improves. As a result, in the coated cutting tool of this embodiment, the crater wear resistance improves, whereby a decrease in the strength of the cutting edge is suppressed, and thus the fracture resistance improves. Meanwhile, in the coated cutting tool of this embodiment, in the compound layer containing a compound having a composition represented by the above formula (1), when x in the above formula (1) is 0.90 or less, Ti is contained. As a result, the toughness improves, whereby the occurrence of thermal cracking can be suppressed, and the fracture resistance improves. From the same point of view, x in the above formula (1) is preferably 0.71 or more and 0.89 or less, and more preferably 0.71 or more and 0.88 or less.

In the coated cutting tool of this embodiment, when the average thickness of the coating layer in the cutting edge line part is expressed as $T_1$, and the average thickness of the coating layer in the rake face at a position 2 mm or more away from the cutting edge line part toward the rake face is expressed as $T_2$, the average thickness $T_1$ is 4.0 μm or more and 10.0 μm or less, the average thickness $T_2$ is 2.0 μm or more and 7.0 μm or less, and $T_2 \le T_1$ is satisfied.

In the coated cutting tool of this embodiment, when the average thickness $T_1$ is 4.0 μm or more, the wear resistance improves, while when the average thickness $T_1$ is 10.0 μm or less, the adhesion to the cemented carbide improves, whereby the occurrence of thermal cracking can be suppressed, and the fracture resistance improves. From the same point of view, the average thickness $T_1$ is preferably 4.4 μm or more and 9.8 μm or less, and more preferably 4.8 μm or more and 9.8 μm or less.

In addition, in the coated cutting tool of this embodiment, when the average thickness $T_2$ is 2.0 μm or more, abnormal damage due to scratching by chips can be prevented, while when the average thickness $T_2$ is 7.0 μm or less, through a treatment after the formation of the coating layer (e.g., dry blasting, shot peening), a residual stress can be effectively imparted to the cemented carbide. From the same point of view, the average thickness $T_2$ is preferably 2.0 µm or more and 6.8 µm or less, and more preferably 3.0 µm or more and 6.8 µm or less.

Further, in the coated cutting tool of this embodiment, when $T_2<T_1$ is satisfied, the wear resistance improves, and also the occurrence of thermal cracking can be suppressed. Accordingly, the occurrence of fracture that will reach other corners can be suppressed.

Yet further, in the coated cutting tool of this embodiment, it is preferable that the difference ($T_1$-$T_2$) between the average thickness $T_1$ and the average thickness $T_2$ is 1.0 µm or more and 4.0 µm or less. In the coated cutting tool of this embodiment, when $T_1$-$T_2$ is 1.0 µm or more, the suppressing effect on the occurrence of fracture that will reach other corners tends to be more prominent, while when $T_1$-$T_2$ is 4.0 µm or less, the balance between wear resistance and fracture resistance tends to be more excellent. From the same point of view, $T_1$-$T_2$ is more preferably 1.2 µm or more and 4.0 µm or less.

Incidentally, in the coated cutting tool of this embodiment, the average thickness of the coating layer at each portion can be determined by measuring the thicknesses of the coating layer at each portion from cross-sections of the coating layer in three or more points at each portion and calculating the arithmetic mean.

In addition, in the coated cutting tool of this embodiment, the rake face preferably has a length of 3.5 mm or more and 20.0 mm or less from the cutting edge line part toward the rake face. The length is more preferably 3.9 mm or more and 18.0 mm or less.

In addition, the coating layer for use in this embodiment preferably includes, between the cemented carbide and the compound layer, a lower layer containing a Ti compound including elemental Ti and at least one element selected from the group consisting of C, N, O, and B. In the coated cutting tool of this embodiment, when the coating layer includes a lower layer containing a Ti compound between the cemented carbide and the compound layer, the wear resistance tends to improve. Specific examples of Ti compounds contained in the lower layer are not particularly limited, and, for example, a TiC layer, a TiN layer, a TiCN layer, a TiCNO layer, and the like can be mentioned.

The average thickness of the lower layer is preferably 0.1 µm or more and 2.0 µm or less, more preferably 0.2 µm or more and 1.5 µm or less, and still more preferably 0.2 µm or more and 1.0 µm or less. In the coated cutting tool of this embodiment, when the average thickness of the lower layer is within the above range, the wear resistance tends to improve.

<Cemented Carbide>

In the coated cutting tool of this embodiment, when the residual stress of the cemented carbide in the cutting edge line part is expressed as $S_1$, and the residual stress of the cemented carbide in the rake face at a position 2 mm or more away from the cutting edge line part toward the rake face is expressed as $S_2$, $S_2<S_1$ is satisfied. In the coated cutting tool of this embodiment, when $S_2<S_1$ is satisfied, a suppressing effect is created on the propagation of cracks formed in the cutting edge line part into the interior of the coated cutting tool during cutting processing. Accordingly, the occurrence of thermal cracking can be suppressed, and the fracture resistance improves. This is presumably because the value of the residual stress $S_2$ is on a compression stress side from the residual stress $S_1$.

In addition, in the coated cutting tool of this embodiment, the residual stress $S_1$ is preferably −0.5 GPa or more and 0.0 GPa or less. In the coated cutting tool of this embodiment, when the residual stress $S_1$ is −0.5 GPa or more, it tends to be possible that changes in the residual stress due to heat generated during processing are suppressed and thus prevented from serving as the origin of damage. Meanwhile, in the coated cutting tool of this embodiment, when the residual stress $S_1$ is 0.0 GPa or less, the fracture resistance tends to improve. From the same point of view, the residual stress $S_1$ is preferably −0.5 GPa or more and −0.1 GPa or less, and more preferably −0.5 GPa or more and −0.2 GPa or less.

In addition, in the coated cutting tool of this embodiment, the residual stress S2 is preferably −2.0 GPa or more and −0.3 GPa or less. In the coated cutting tool of this embodiment, when the residual stress $S_2$ is −2.0 GPa or more, it tends to be possible to suppress delamination caused by the connection of cracks in the coating layer due to the influence of the treatment after the formation of the coating layer. Meanwhile, in the coated cutting tool of this embodiment, when the residual stress $S_2$ is −0.3 GPa or less, it tends to be possible to suppress the propagation of thermal cracks formed in the cutting edge line part. From the same point of view, the residual stress $S_2$ is preferably −1.9 GPa or more and −0.4 GPa or less, and more preferably −1.9 GPa or more and −0.5 GPa or less.

The residual stress is an internal stress remaining within the coating layer (inherent strain). Generally, a stress represented by a numerical value with "−" (minus) is called "compression stress", while a stress represented by a numerical value with "+" (plus) is called "tensile stress". In this embodiment, in the expression of the magnitude of a residual stress, a greater numerical value with "+" (plus) is expressed as a higher residual stress, while a greater numerical value with "−" (minus) is expressed as a lower residual stress.

Incidentally, the residual stress can be measured by a $\sin^2\psi$ method using a X-ray diffractometer. Then, such a residual stress can be measured by measuring the stresses in three arbitrary points at each portion (it is preferable that these points are selected to be 0.5 mm or more away from each other so that the stress at the portion can be represented) by the above $\sin^2\psi$ method and determining the average.

As a calculation technique for the quantification of strain within a crystal grain by an electron backscatter diffraction (hereinafter also referred to as "EBSD") method utilizing a scanning electron microscope, for example, Kernel Average Misorientation (hereinafter also referred to as "KAM"), which is obtained by quantifying the misorientation between an arbitrary measurement point and neighboring measurement points within a crystal grain, can be mentioned. Hereinafter, the KAM value will be described.

[KAM Value]

A KAM value is a numerical value that shows local misorientation, which is a difference in crystal orientation between neighboring measurement points, in the crystal orientation analysis based on the EBSD method. A greater KAM value indicates a greater difference in crystal orientation between neighboring measurement points, and a smaller KAM value indicates smaller local strain within the crystal grain.

In the coated cutting tool of this embodiment, in the cemented carbide, the proportion of measurement points where tungsten carbide (WC) has a KAM value of 1° or less (hereinafter also referred to as "$KAM_c$") is preferably 90% or more and 98% or less. A $KAM_c$ of 90% or more indicates that the region with high local strain is small. This indicates a smaller region serving as the origin of destruction. As a result, in the coated cutting tool of this embodiment, the fracture resistance tends to improve. Meanwhile, when $KAM_c$ is 98% or less, production tends to be easy. From the same point of view, $KAM_c$ is more preferably 90% or more and 97% or less, and still more preferably 90% or more and 96% or less.

In this embodiment, the KAM value can be measured as follows. A coated cutting tool sample is polished in the direction approximately parallel to the surface of the cemented carbide to expose a cross-section at a position 0.5 μm from the surface of the cemented carbide toward the interior of the cemented carbide. Using EBSD (manufactured by TSL Corporation), each measurement region of the cross-section in the cemented carbide is divided into regular hexagonal measurement points (hereinafter also referred to as "pixels"). With respect to each divided pixel, a Kikuchi pattern is obtained from the reflected electrons of the electron beam incident on the cross-section (polished surface) of the sample, thereby measuring the orientations of the pixels. The obtained orientation data is analyzed using the analysis software of the EBSD to calculate various parameters. The measurement conditions are set as follows: accelerating voltage: 15 kV, measurement region dimension: 30 μm×50 μm, distance between neighboring pixels (step size): 0.05 μm. A neighboring pixel whose misorientation from the measurement center pixel is 5° or more is judged as being beyond the grain boundary of the single crystal in which the measurement center pixel is located, and thus excluded from the calculation of a KAM value. Specifically, the KAM value is determined as the average misorientation between a certain pixel within a crystal grain and neighboring pixels present in a range not beyond the grain boundary of the crystal grain. That is, a KAM value can be represented by the following formula (1).

[Equation 1]

$$KAM = \frac{\sum_{j=1}^{n} \alpha_{i,j}}{n} \quad (1)$$

(In formula (1), n represents the number of pixels j neighboring an arbitrary pixel i in the same crystal grain, and $\alpha_{i,j}$ represents the crystal misorientation determined from the crystal orientation in the pixel i and the crystal orientations in the pixels j.)

Then, in the cemented carbide, the KAM values are calculated for all the pixels constituting the total area of the measurement region, and, taking the total number of measurement points (pixels) as 100%, the proportion of measurement points (pixels) where the KAM value is 1° or less is determined. Incidentally, as the proportion of measurement points where the KAM value is 1° or less, a numerical value obtained by averaging the proportions determined for three arbitrary measurement regions is employed.

It is preferable that the cemented carbide for use in this embodiment is based on a WC phase, contains Co in a proportion of 5.0 mass % or more and 15.0 mass % or less, and contains Cr in a proportion of, as $Cr_3C_2$, 0.3 mass % or more and 1.0 mass % or less. In the cemented carbide for use in this embodiment, when 5.0 mass % or more Co is contained, the toughness improves, and thus the fracture resistance of the coated cutting tool tends to improve. Meanwhile, in the cemented carbide for use in this embodiment, when the Co content is 15.0 mass % or less, the wear resistance of the coated cutting tool tends to improve. In addition, in the cemented carbide for use in this embodiment, when 0.3 mass % or more Cr is contained as $Cr_3C_2$, the grain growth of tungsten carbide is suppressed, and thus the number of particles serving as the origin of destruction decreases. As a result, the fracture resistance of the coated cutting tool tends to improve. Meanwhile, in the cemented carbide for use in this embodiment, when the content of Cr as $Cr_3C_2$ is 1.0 mass % or less, the fracture resistance of the coated cutting tool tends to improve. The reason therefor is not clear, but presumably because the precipitation of $Cr_3C_2$, which is likely to serve as the origin of destruction, can be suppressed. From the same point of view, it is more preferable that the cemented carbide for use in this embodiment is based on a WC phase, contains Co in a proportion of 5.5 mass % or more and 13.0 mass % or less, and contains Cr in a proportion of, as $Cr_3C_2$, 0.4 mass % or more and 0.9 mass % or less. Further, it is particularly preferable that Co is contained in a proportion of 6.1 mass % or more and 12.0 mass % or less, and Cr is contained in a proportion of, as $Cr_3C_2$, 0.4 mass % or more and 0.8 mass % or less. Here, the WC phase means a phase composed of tungsten carbide, and "based on a WC phase" means that the proportion of the WC phase in the cemented carbide is 50 mass % or more, preferably 60 mass % or more, more preferably 70 mass % or more, and still more preferably 80 mass % or more. The proportion of the WC phase in the cemented carbide is particularly preferably 86.0 mass % or more and 94.7 mass % or less.

Each composition and each proportion (mass %) in the cemented carbide for use in this embodiment are calculated as follows. The cross-sectional structures of at least three arbitrary points in the interior of the cemented carbide (e.g., a cross-sectional structure at a position 500 μm or more deep from the surface toward the interior) are observed under a scanning electron microscope (SEM) equipped with an energy dispersive X-ray spectrometer (EDS), and each composition of the cemented carbide is measured by the EDS. From the results, the proportion of each composition can be calculated. That is, the cemented carbide is polished in the direction orthogonal to the surface thereof, the resulting exposed arbitrary cross-sectional structure is observed under an SEM, and, using the EDS attached to the SEM, each composition and proportion (mass %) in the cemented carbide are determined. More specifically, the arbitrary cross-sectional structure in the cemented carbide is observed under an EDS-equipped SEM at 2,000 to 5,000× magnification and subjected to surface analysis. Further, by conversion from the atomic percentage of each composition obtained, the mass percentage of each composition can be calculated. For example, in the case of WC, calculation is possible as follows. With the atomic ratio W:C being 1:1, the atomic percentage of WC is determined and then converted into a mass percentage.

<Method for Forming Coating Layer>

In a method for forming the coating layer according to this embodiment, on the surface of a cemented carbide processed into a tool shape, a compound layer containing a compound having a composition represented by the above formula (1) is formed as a coating layer. Further, as necessary, between the cemented carbide and the compound layer, a lower layer made of a Ti compound including elemental Ti and at least one element selected from the group consisting of C, N, O, and B may be formed.

As a method for forming the coating layer in the coated cutting tool of this embodiment, for example, the following method can be mentioned. However, the coating layer forming method is not limited thereto.

The compound layer contained in the coating layer can be formed by a chemical deposition method in which the raw material composition is $TiCl_4$: 0.2 to 0.4 mol %, $AlCl_3$: 0.5 to 2.0 mol %, $NH_3$: 2.0 to 4.5 mol %, and $H_2$: remainder, the temperature is 700 to 850° C., and the pressure is 2.5 to 5.0 hPa.

In the case where a lower layer made of a Ti compound is formed, it is possible that before forming the compound layer described above, the raw material composition, temperature, and pressure are adjusted according to the desired Ti compound, and a lower layer made of a Ti compound is formed by a chemical deposition method. As a specific example of a method for forming the lower layer, for example, the following methods can be mentioned. Incidentally, in the case where a lower layer is formed, after the formation of the lower layer, a step of lowering the temperature to 700° C. to 850° C. is preferably performed for the formation of a compound layer.

For example, a Ti compound layer formed of a Ti nitride layer (hereinafter also referred to as "TiN layer") can be formed by a chemical deposition method in which the raw material composition is $TiC_{14}$: 5.0 to 10.0 mol %, $N_2$: 20 to 60 mol %, and $H_2$: remainder, the temperature is 850 to 950° C., and the pressure is 300 to 400 hPa.

A Ti compound layer formed of a Ti carbide layer (hereinafter also referred to as "TiC layer") can be formed by a chemical deposition method in which the raw material composition is $TiCl_4$: 1.5 to 3.5 mol %, $CH_4$: 3.5 to 5.5 mol %, and $H_2$: remainder, the temperature is 950 to 1,050° C., and the pressure is 70 to 80 hPa.

A Ti compound layer formed of a Ti carbonitride layer (hereinafter also referred to as "TiCN layer") can be formed by a chemical deposition method in which the raw material composition is $TiCl_4$: 5.0 to 7.0 mol %, $CH_3CN$: 0.5 to 1.5 mol %, and $H_2$: remainder, the temperature is 800 to 900° C., and the pressure is 60 to 80 hPa.

A Ti compound layer formed of a Ti oxycarbonitride layer (hereinafter also referred to as "TiCNO layer") can be formed by a chemical deposition method in which the raw material composition is $TiCl_4$: 3.0 to 4.0 mol %, CO: 0.5 to 1.0 mol %, $N_2$: 30 to 40 mol %, and $H_2$: remainder, the temperature is 950 to 1,050° C., and the pressure is 50 to 150 hPa.

A Ti compound layer formed of a Ti oxycarbide layer (hereinafter also referred to as "TiCO layer") can be formed by a chemical deposition method in which the raw material composition is $TiCl_4$: 1.0 to 2.0 mol %, CO: 2.0 to 3.0 mol %, and $H_2$: remainder, the temperature is 950 to 1,050° C., and the pressure is 50 to 150 hPa.

Figure 2:
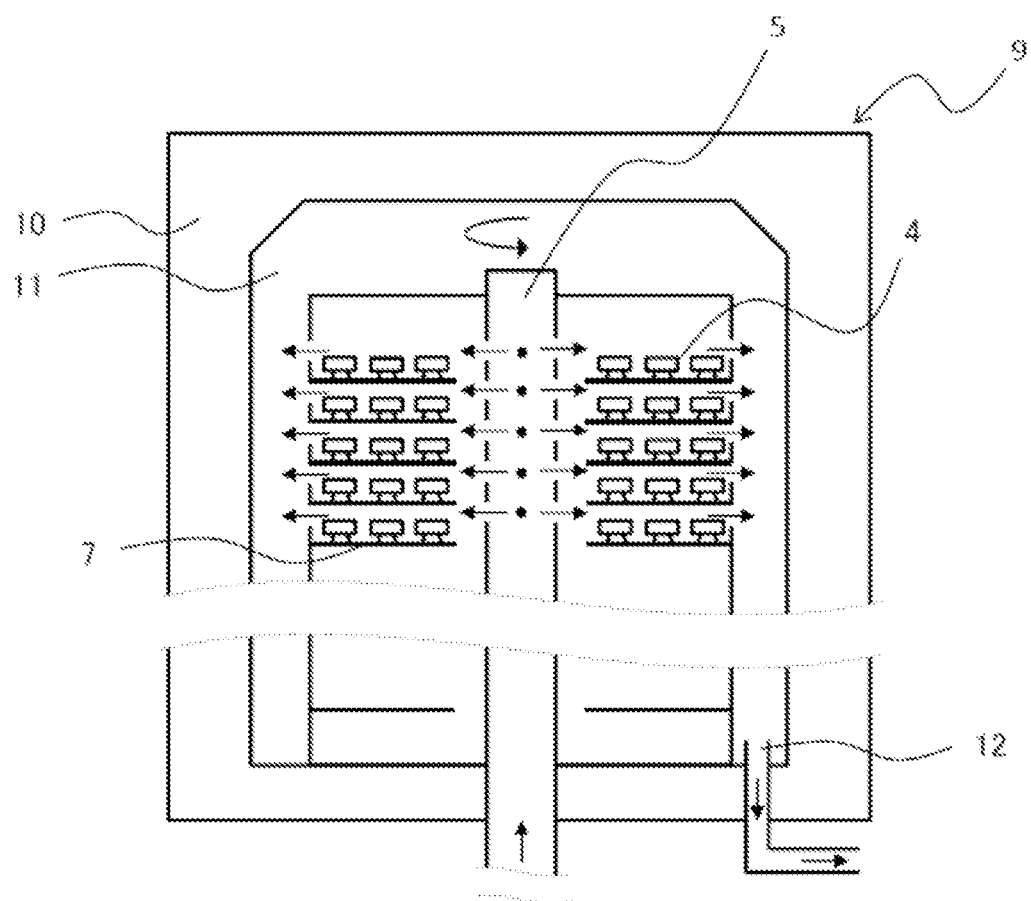
FIG. 2 A schematic cross-sectional view showing an example of a chemical vapor deposition apparatus used for forming a coating layer in the production of the coated cutting tool of the invention.

FIG. 2 is a schematic cross-sectional view showing an example of a chemical vapor deposition apparatus used for forming the coating layer in the production of the coated cutting tool of this embodiment. A chemical vapor deposition apparatus 9 includes a gas introduction jig 5, a jig 7 on which the coated cutting tool 4 is mounted, a heater 10, a reaction vessel 11, and a gas exhaust pipe 12. A raw material gas is introduced into the reaction vessel 11 from the gas introduction jig 5 and, while being heated with the heater 10, chemically vapor-deposited on each cutting tool on the jig 7 to form a coating layer. The gas is then discharged from the gas exhaust pipe 12.

Figure 3:
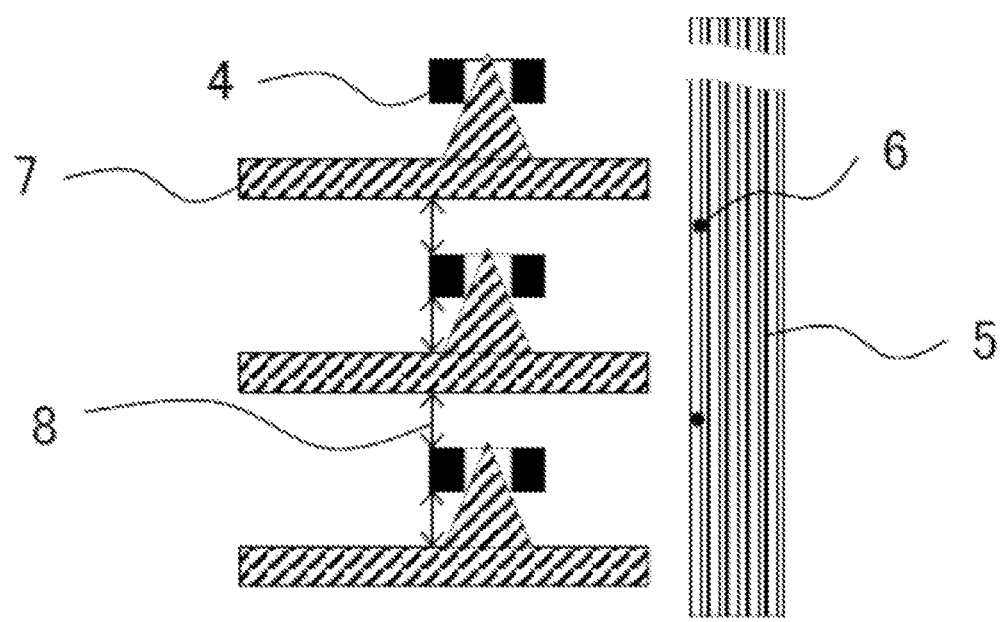
FIG. 3 A schematic cross-sectional view enlarging the vicinity of a gas introduction jig in the chemical vapor deposition apparatus of FIG. 2.

FIG. 3 is a schematic cross-sectional view enlarging the vicinity of the gas introduction jig 5 in the chemical vapor deposition apparatus 9 of FIG. 2. The raw material gas is, through the gas introduction jig 5, introduced into the reaction vessel from a gas blowout hole 6, and deposited on the surface of each cutting tool 4 on the jig 7. Here, by adjusting an interval 8 between each cutting tool 4 and the jig 7, the thickness of the coating layer at each portion can be controlled. Specifically, in FIG. 3, the upper surface of each cutting tool 4 is a rake face. The length from the rake face to the bottom surface of the jig 7 on which each cutting tool 4 is mounted and the length from the rake face on the lower surface of each cutting tool 4 to the upper surface of the jig on which each cutting tool 4 is mounted are each adjusted, whereby the thickness of the coating layer at each portion can be controlled. For example, when the interval 8 between each cutting tool 4 and the jig 7 is reduced, the average thickness $T_2$ of the coating layer in the rake face at a position 2 mm or more away from the cutting edge line part toward the rake face tends to be small relative to the average thickness $T_1$ of the covering layer in the cutting edge line part. In addition, when the pressure during the formation of a coating layer is reduced, the difference $(T_1-T_2)$ between the average thickness $T_2$ of the coating layer in the rake face at a position 2 mm or more away from the cutting edge line part toward the rake face and the average thickness $T_1$ of the coating layer in the cutting edge line part tends to increase.

As the specific length of the interval 8 between each cutting tool 4 and the jig 7, for example, 2.0 to 4.0 mm is preferable.

In addition, in order to control the composition represented by the above formula (1), the raw material composition needs to be suitably adjusted. Specifically, as a method for controlling the ratio of Ti and Al, for example, in the raw material composition, when the $AlCl_3/(AlCl_3+TiC14)$ ratio is increased, the Al content ratio tends to increase. More specifically, for example, in the raw material composition, when the $AlCl_3/(AlCl_3+TiCl_4)$ ratio is set at 0.70 or more and 0.90 or less, the Al content ratio in the above formula (1) can be controlled within the above specific range.

When the formed coating layer is subjected to dry shot blasting, wet shot blasting, or shot peening, and conditions therefor are adjusted, the residual stress value of the cemented carbide can be controlled. For example, as conditions for dry shot blasting, the projection material may be projected at a projection pressure of 1.8 to 2.1 bar for a projection time of 20 to 40 seconds in such a manner that the angle of projection relative to the surface of the cemented carbide is 90°. In terms of controlling the residual stress value within the above range more easily, the projection material (media) in dry shot blasting is preferably at least one material having an average particle diameter of 120 to 400 μm (in the case where the projection material is made of steel, 380 to 420 μm) and selected from the group consisting of $Al_2O_3$ and SiC.

In dry shot blasting, with an increase in the average particle diameter of the projection material (media), the residual stress value of the cemented carbide tends to decrease (compression stress value side). In addition, as the angle of projection approaches 45° from 90°, the residual stress $S_1$ of the cemented carbide in the cutting edge line part tends to decrease (compression stress value side). In addition, with an increase in the projection pressure, the residual stress value of the cemented carbide tends to decrease. In addition, with a decrease in the projection time, the residual stress value of the cemented carbide tends to decrease.

In addition, with a decrease in the thickness of the coating layer (e.g., compound layer), in the case where dry shot blasting is performed, the difference between the residual stress $S_1$ of the cemented carbide in the cutting edge line part and the residual stress $S_2$ of the cemented carbide in the rake face at a position 2 mm or more away from the cutting edge line part toward the rake face tends to decrease, satisfying $S_2<S_1$. This is presumably because when the thickness of the compound layer (total thickness of the coating layer) is smaller, the energy of dry shot blasting is more likely to be transmitted to the cemented carbide.

In addition, as a method for controlling the proportion of measurement points where tungsten carbide (WC) has a KAM value of 1° or less in the cemented carbide, for example, a method in which the formed coating layer is subjected to dry shot blasting, wet shot blasting, or shot peening, and conditions therefor are adjusted, can be mentioned. Specifically, for example, a method in which, in dry shot blasting, the projection pressure or the kind and average particle diameter of the projection material are adjusted can be mentioned. More specifically, for example, a method in which, in dry shot blasting, the projection pressure is set at 1.8 to 2.5 bar, and at least one material having an average particle diameter of 50 to 140 μm and selected from the group consisting of $Al_2O_3$ and SiC is used as the projection material (media), can be mentioned. When the projection pressure is set higher than the above range, or when steel is used as the projection material (media), and the average particle diameter is set higher than the above range, the proportion of measurement points where tungsten carbide (WC) has a KAM value of 1° or less tends to decrease.

The thickness of the coating layer at each portion in the coated cutting tool of this embodiment can be measured by observing the cross-sectional structure of the coated cutting tool using an optical microscope, a scanning electron microscope (SEM), a field emission scanning electron microscope (FE-SEM), or the like. Incidentally, the average thickness of the coating layer at each portion in the coated cutting tool of this embodiment can be determined as the arithmetic mean of the thicknesses at each portion measured in three or more points. In addition, the composition of the coating layer can be measured from the cross-sectional structure of the coated cutting tool of this embodiment using an energy dispersive X-ray spectrometer (EDS), a wavelength dispersive X-ray spectrometer (WDS), or the like.

EXAMPLES

Hereinafter, the invention will be described in further detail with reference to examples. However, the invention is not limited to these examples.

Two kinds of substrates were prepared: an insert of SEET1203AGTN (cemented carbide having a composition 87.2WC-12.0Co-0.8$Cr_3C_2$ (all mass %), hereinafter also referred to as "substrate 1") and an insert of SEET1203AGTN (cemented carbide having a composition 93. 5WC-6. 1Co-0. 4$Cr_3C_2$ (all mass %), hereinafter also referred to as "substrate 2"). The cutting edge line part of each substrate was subjected to round honing with a SiC brush, and then the surface of the substrate was washed. Incidentally, in order to perform the cutting test 1 described below, samples using the substrate 1 (the following inventive products 1 to 13 and comparative products 1 to 9) were prepared, three samples for each product. Meanwhile, in order to perform the cutting test 2 described below, samples using the substrate 2 (inventive products 1 to 13 and comparative products 1 to 9) were prepared, one sample for each product. Therefore, in the following method for forming a coating layer, three substrates 1 and one substrate 2, four substrates in total, were simultaneously placed in a chemical vapor deposition apparatus, and a predetermined coating layer was formed on each substrate. [Inventive Products 1 to 13 and Comparative Products 1 to 9]

After the surface of each substrate was washed, a coating layer was formed by a chemical vapor deposition method. First, the substrate was fed into the externally heated chemical vapor deposition apparatus shown in FIG. 2, and, under the raw material composition, temperature, and pressure conditions shown in Table 1, a compound layer having the composition shown in Table 2 was formed to the average thickness shown in Table 2 on the surface of the substrate. Here, the interval between each cutting tool and the jig in the chemical vapor deposition apparatus was adjusted as shown in Table 1, whereby the thickness of the coating layer (compound layer) at each portion was controlled. Specifically, as shown in FIG. 3 enlarging the vicinity of the gas introduction jig in the chemical vapor deposition apparatus, with the upper surface of each cutting tool 4 serving as the rake face, the length from the rake face to the bottom surface of the jig 7 on which each cutting tool 4 was mounted and the length from the rake face on the lower surface of each cutting tool 4 to the upper surface of the jig on which each cutting tool 4 was mounted were each adjusted as shown in Table 1, whereby the thickness of the coating layer (compound layer) at each portion was controlled.

Further, after forming the coating layer on the surface of the substrate, the coating layer surface was subjected to dry shot blasting using the projection material shown in Table 3 under the projection conditions shown in Table 3. In this manner, coated cutting tools of inventive products 1 to 13 and comparative products 1 to 7 were obtained.

The thickness of the coating layer at each portion in a sample was determined as follows. That is, using FE-SEM, the thicknesses in arbitrary three cross-sectional points in the cutting edge line part of the coated cutting tool and the thicknesses in arbitrary three cross-sectional points at a position 2 mm or more away from the cutting edge line part toward the rake face were measured, and the arithmetic mean of each was determined as an average thickness (sequentially referred to as "$T_1$" and "$T_2$"). The composition of the coating layer (compound layer) of the obtained sample was measured using an EDS in a cross-section near the position up to 50 μm from the cutting edge line part of the coated cutting tool toward the center of the rake face. The measurement results are shown in Table 2.

TABLE 1

| | | | Compound Layer | | | | | Interval between Coated |
| | | | Raw Material Composition (mol %) | | | | | Cutting Tool and Jig |
| Sample | Temperature (° C.) | Pressure (hPa) | $TiCl_4$ | $AlCl_3$ | $NH_3$ | $H_2$ | $AlCl_3/(AlCl_3 + TiCl_4)$ | (mm) |
| --- | --- | --- | --- | --- | --- | --- | --- | --- |
| Inventive Product 1 | 750 | 3.0 | 0.3 | 1.2 | 3.5 | 95.0 | 0.80 | 3.0 |
| Inventive Product 2 | 750 | 3.5 | 0.2 | 0.5 | 3.5 | 95.8 | 0.71 | 3.0 |
| Inventive Product 3 | 700 | 3.0 | 0.3 | 2.0 | 4.0 | 93.7 | 0.87 | 3.0 |

TABLE 1-continued

| | Compound Layer | | | | | | Interval between Coated |
|---|---|---|---|---|---|---|---|
| | | | Raw Material Composition (mol %) | | | | Cutting Tool and Jig |
| Sample | Temperature (° C.) | Pressure (hPa) | TiCl$_4$ | AlCl$_3$ | NH$_3$ | H$_2$ | AlCl$_3$/(AlCl$_3$ + TiCl$_4$) | (mm) |
| Inventive Product 4 | 750 | 3.0 | 0.3 | 1.2 | 3.5 | 95.0 | 0.80 | 3.0 |
| Inventive Product 5 | 750 | 2.5 | 0.3 | 1.2 | 2.5 | 96.0 | 0.80 | 3.0 |
| Inventive Product 6 | 750 | 3.0 | 0.2 | 0.9 | 3.5 | 95.4 | 0.82 | 2.0 |
| Inventive Product 7 | 750 | 5.0 | 0.3 | 1.2 | 3.5 | 95.0 | 0.80 | 4.0 |
| Inventive Product 8 | 750 | 3.0 | 0.2 | 0.9 | 2.5 | 96.4 | 0.82 | 3.0 |
| Inventive Product 9 | 750 | 4.0 | 0.3 | 1.2 | 3.5 | 95.0 | 0.80 | 3.0 |
| Inventive Product 10 | 750 | 2.5 | 0.3 | 1.2 | 3.5 | 95.0 | 0.80 | 3.0 |
| Inventive Product 11 | 750 | 3.0 | 0.3 | 1.3 | 4.0 | 94.4 | 0.81 | 3.0 |
| Inventive Product 12 | 700 | 3.0 | 0.3 | 1.8 | 3.0 | 94.9 | 0.86 | 3.0 |
| Inventive Product 13 | 700 | 3.0 | 0.3 | 1.7 | 3.5 | 94.5 | 0.85 | 3.0 |
| Comparative Product 1 | 750 | 3.0 | 0.5 | 1.0 | 3.0 | 95.5 | 0.67 | 3.0 |
| Comparative Product 2 | 700 | 3.0 | 0.2 | 2.3 | 3.0 | 94.5 | 0.92 | 3.0 |
| Comparative Product 3 | 750 | 4.0 | 0.3 | 1.2 | 3.0 | 95.5 | 0.80 | 5.0 |
| Comparative Product 4 | 750 | 2.0 | 0.3 | 1.2 | 5.0 | 93.5 | 0.80 | 3.0 |
| Comparative Product 5 | 900 | 2.0 | 0.3 | 1.2 | 3.0 | 95.5 | 0.80 | 1.0 |
| Comparative Product 6 | 750 | 5.0 | 0.5 | 2.2 | 3.0 | 94.3 | 0.81 | 6.0 |
| Comparative Product 7 | 750 | 5.0 | 0.3 | 1.2 | 4.0 | 94.5 | 0.80 | 6.0 |
| Comparative Product 8 | 750 | 5.0 | 0.3 | 1.2 | 4.0 | 94.5 | 0.80 | 6.0 |
| Comparative Product 9 | 750 | 5.0 | 0.3 | 1.2 | 4.0 | 94.5 | 0.80 | 6.0 |

TABLE 2

| | Coating Layer Compound Layer (Al$_x$Ti$_{1-x}$)N | | | | |
|---|---|---|---|---|---|
| | Atomic | Average Thickness (μm) | | T$_1$ − T$_2$ | Thickness |
| Sample | Ratio x | T$_1$ | T$_2$ | (μm) | Relation |
| Inventive Product 1 | 0.80 | 6.0 | 4.0 | 2.0 | T$_2$ < T$_1$ |
| Inventive Product 2 | 0.71 | 6.0 | 4.0 | 2.0 | T$_2$ < T$_1$ |
| Inventive Product 3 | 0.88 | 6.2 | 4.2 | 2.0 | T$_2$ < T$_1$ |
| Inventive Product 4 | 0.79 | 4.4 | 3.0 | 1.4 | T$_2$ < T$_1$ |
| Inventive Product 5 | 0.80 | 9.8 | 5.8 | 4.0 | T$_2$ < T$_1$ |
| Inventive Product 6 | 0.81 | 4.8 | 2.0 | 2.8 | T$_2$ < T$_1$ |
| Inventive Product 7 | 0.80 | 8.0 | 6.8 | 1.2 | T$_2$ < T$_1$ |
| Inventive Product 8 | 0.81 | 5.8 | 3.8 | 2.0 | T$_2$ < T$_1$ |
| Inventive Product 9 | 0.81 | 6.2 | 4.0 | 2.2 | T$_2$ < T$_1$ |
| Inventive Product 10 | 0.80 | 6.0 | 3.5 | 2.5 | T$_2$ < T$_1$ |
| Inventive Product 11 | 0.81 | 6.2 | 4.2 | 2.0 | T$_2$ < T$_1$ |
| Inventive Product 12 | 0.85 | 5.8 | 3.8 | 2.0 | T$_2$ < T$_1$ |
| Inventive Product 13 | 0.85 | 5.8 | 3.8 | 2.0 | T$_2$ < T$_1$ |
| Comparative Product 1 | 0.65 | 6.0 | 4.0 | 2.0 | T$_2$ < T$_1$ |
| Comparative Product 2 | 0.95 | 6.0 | 4.0 | 2.0 | T$_2$ < T$_1$ |
| Comparative Product 3 | 0.80 | 3.5 | 3.0 | 0.5 | T$_2$ < T$_1$ |
| Comparative Product 4 | 0.80 | 10.8 | 6.2 | 4.6 | T$_2$ < T$_1$ |
| Comparative Product 5 | 0.79 | 4.6 | 1.4 | 3.2 | T$_2$ < T$_1$ |
| Comparative Product 6 | 0.81 | 8.2 | 7.5 | 0.7 | T$_2$ < T$_1$ |
| Comparative Product 7 | 0.80 | 6.5 | 6.7 | −0.2 | T$_1$ < T$_2$ |
| Comparative Product 8 | 0.80 | 4.4 | 5.0 | −0.6 | T$_1$ < T$_2$ |
| Comparative Product 9 | 0.80 | 4.4 | 5.0 | −0.6 | T$_1$ < T$_2$ |

TABLE 3

| | | Dry Shot Blasting Conditions | | | |
|---|---|---|---|---|---|
| | Projection Material | | Projection Conditions | | |
| Sample | Material | Average Particle Size (μm) | Angle of Projection (°) | Projection Pressure (bar) | Projection Time (sec) |
| Inventive Product 1 | Al$_2$O$_3$ | 130 | 90 | 1.8 | 30 |
| Inventive Product 2 | Al$_2$O$_3$ | 130 | 90 | 1.8 | 30 |
| Inventive Product 3 | Al$_2$O$_3$ | 130 | 90 | 1.8 | 30 |
| Inventive Product 4 | Al$_2$O$_3$ | 120 | 90 | 1.8 | 20 |
| Inventive Product 5 | SiC | 140 | 90 | 1.8 | 40 |
| Inventive Product 6 | Al$_2$O$_3$ | 120 | 90 | 1.8 | 20 |
| Inventive Product 7 | Al$_2$O$_3$ | 130 | 90 | 1.6 | 40 |
| Inventive Product 8 | Al$_2$O$_3$ | 130 | 90 | 2.1 | 20 |
| Inventive Product 9 | SiC | 120 | 90 | 1.6 | 30 |
| Inventive Product 10 | Al$_2$O$_3$ | 130 | 90 | 2.1 | 20 |
| Inventive Product 11 | SiC | 120 | 90 | 1.6 | 30 |
| Inventive Product 12 | Al$_2$O$_3$ | 130 | 90 | 2.1 | 20 |
| Inventive Product 13 | Steel | 400 | 90 | 1.8 | 30 |
| Comparative | Al$_2$O$_3$ | 130 | 90 | 1.8 | 30 |

TABLE 3-continued

| | Dry Shot Blasting Conditions | | | | |
|---|---|---|---|---|---|
| | Projection Material | | Projection Conditions | | |
| Sample | Material | Average Particle Size (μm) | Angle of Projection (°) | Projection Pressure (bar) | Projection Time (sec) |
| Comparative Product 2 | Al₂O₃ | 130 | 90 | 1.8 | 30 |
| Comparative Product 3 | Al₂O₃ | 120 | 90 | 1.8 | 20 |
| Comparative Product 4 | SiC | 140 | 90 | 1.8 | 40 |
| Comparative Product 5 | Al₂O₃ | 120 | 90 | 1.8 | 20 |
| Comparative Product 6 | Al₂O₃ | 130 | 90 | 1.6 | 30 |
| Comparative Product 7 | Al₂O₃ | 130 | 90 | 2.1 | 10 |
| Comparative Product 8 | SiC | 130 | 45 | 1.8 | 40 |
| Comparative Product 9 | Al₂O₃ | 110 | 90 | 1.8 | 40 |

[Measurement of Residual Stress]

With respect to each obtained sample, the residual stress of the cemented carbide was measured by a $\sin^2\psi$ method using an X-ray diffractometer. The stresses in three arbitrary points in the cutting edge line part were measured, and the average (arithmetic mean) was defined as the residual stress $S_1$ of the cemented carbide. Meanwhile, the stresses in three arbitrary points at a position 2 mm or more away from the cutting edge line part toward the rake face were measured, and the average (arithmetic mean) was defined as the residual stress $S_2$ of the cemented carbide. The results are shown in Table 4.

[Measurement of KAM Value]

With respect to each obtained sample, the KAM value of the cemented carbide was measured as follows. The coated cutting tool sample was polished in the direction approximately parallel to the surface of the cemented carbide to expose a cross-section at a position 0.5 μm from the surface of the cemented carbide toward the interior of the cemented carbide. Using EBSD (manufactured by TSL Corporation), each measurement region of the cross-section in the cemented carbide was divided into regular hexagonal measurement points (hereinafter also referred to as "pixels"). With respect to each divided pixel, a Kikuchi pattern was obtained from the reflected electrons of the electron beam incident on the cross-section (polished surface) of the sample, thereby measuring the orientations of the pixels. The obtained orientation data was analyzed using the analysis software of the EBSD to calculate various parameters. The measurement conditions were set as follows: accelerating voltage: 15 kV, measurement region dimension: 30 μm×50 μm, distance between neighboring pixels (step size): 0.05 μm. A neighboring pixel whose misorientation from the measurement center pixel was 5° or more was judged as being beyond the grain boundary of the single crystal in which the measurement center pixel was located, and thus excluded from the calculation of a KAM value. Specifically, the KAM value was determined as the average misorientation between a certain pixel within a crystal grain and neighboring pixels present in a range not beyond the grain boundary of the crystal grain. That is, the KAM value was calculated by the following formula (1).

[Equation 2]

$$KAM = \frac{\sum_{j=1}^{n} \alpha_{i,j}}{n} \quad (1)$$

(In formula (1), n represents the number of pixels j neighboring an arbitrary pixel i in the same crystal grain, and $\alpha_{i,j}$ represents the crystal misorientation determined from the crystal orientation in the pixel i and the crystal orientations in the pixels j.)

Then, in the cemented carbide, the KAM values were calculated for all the pixels constituting the total area of the measurement region, and, taking the total number of measurement points (pixels) as 100%, the proportion of measurement points (pixels) where the KAM value was 1° or less was determined. Incidentally, as the proportion of measurement points where the KAM value was 1° or less, a numerical value obtained by averaging the proportions determined for three arbitrary measurement regions was employed. In addition, the proportion of measurement points where tungsten carbide (WC) has a KAM value of 1° or less in the cemented carbide is expressed as $KAM_c$. The measurement results are shown in Table 4.

TABLE 4

| | Cemented Carbide | | | |
|---|---|---|---|---|
| | Residual Stress (GPa) | | Residual Stress | |
| Sample | $S_1$ | $S_2$ | Relation | $KAM_c$ (%) |
| Inventive Product 1 | −0.3 | −1.1 | $S_2 < S_1$ | 96 |
| Inventive Product 2 | −0.2 | −1.2 | $S_2 < S_1$ | 95 |
| Inventive Product 3 | −0.3 | −1.2 | $S_2 < S_1$ | 95 |
| Inventive Product 4 | −0.3 | −1.2 | $S_2 < S_1$ | 96 |
| Inventive Product 5 | −0.3 | −1.0 | $S_2 < S_1$ | 96 |
| Inventive Product 6 | −0.4 | −1.2 | $S_2 < S_1$ | 94 |
| Inventive Product 7 | −0.2 | −0.5 | $S_2 < S_1$ | 94 |
| Inventive Product 8 | −0.5 | −1.5 | $S_2 < S_1$ | 94 |
| Inventive Product 9 | −0.1 | −0.9 | $S_2 < S_1$ | 96 |
| Inventive Product 10 | −0.3 | −1.9 | $S_2 < S_1$ | 94 |
| Inventive Product 11 | −0.2 | −0.5 | $S_2 < S_1$ | 96 |
| Inventive Product 12 | −0.4 | −1.3 | $S_2 < S_1$ | 90 |
| Inventive Product 13 | −0.4 | −1.4 | $S_2 < S_1$ | 86 |
| Comparative Product 1 | −0.3 | −1.1 | $S_2 < S_1$ | 96 |
| Comparative Product 2 | −0.3 | −1.1 | $S_2 < S_1$ | 96 |
| Comparative Product 3 | −0.3 | −1.2 | $S_2 < S_1$ | 96 |
| Comparative Product 4 | −0.1 | −1.0 | $S_2 < S_1$ | 96 |
| Comparative Product 5 | −0.4 | −1.5 | $S_2 < S_1$ | 94 |
| Comparative Product 6 | −0.3 | 0.4 | $S_1 < S_2$ | 94 |
| Comparative Product 7 | −0.3 | −1.2 | $S_2 < S_1$ | 95 |

TABLE 4-continued

| | Cemented Carbide | | | |
|---|---|---|---|---|
| | Residual Stress (GPa) | | Residual Stress | |
| Sample | $S_1$ | $S_2$ | Relation | $KAM_c$ (%) |
| Comparative Product 8 | −1.0 | −0.8 | $S_1 < S_2$ | 95 |
| Comparative Product 9 | −0.3 | −0.8 | $S_2 < S_1$ | 79 |

Using the obtained inventive products 1 to 13 and comparative products 1 to 9, cutting tests were performed under the following conditions.

[Cutting Test 1]
Insert: SEET1203AGTN,
Substrate: 87.2WC-12.0Co-0.8Cr$_3$C$_2$ (all mass %),
Workpiece: Rectangular parallelepiped SCM440
Cutting speed: 250 m/min,
Feed per tooth: 0.20 mm/tooth,
Depth of cut: 2.0 mm,
Coolant: Absent,
Evaluation Criteria: The point of time when the sample was chipped was defined as the tool life, and, with respect to three samples, whether it was possible to use all the four corners until the tool life was evaluated. That is, out of a maximum of 12 corners (three samples X four corners), the number of corners where cracks propagated to other corners upon fracture was checked. When the number of corners where cracks propagated to other corners upon fracture was "0", such a case was rated as "A", "1" was rated as "B", and "2 or more" was rated as "C". The measurement results are shown in Table 5.

[Cutting Test 2]
Insert: SEET1203AGTN,
Substrate: 93.5WC-6.1Co-0.4Cr$_3$C$_2$ (all mass %),
Workpiece: Rectangular parallelepiped FCD600
Cutting speed: 300 m/min,
Feed per tooth: 0.20 mm/tooth,
Depth of cut: 2.0 mm,
Coolant: Present,
Evaluation Criteria: The point of time when the sample was chipped or the maximum width of flank wear reached 0.3 mm was defined as the tool life, and the processing length until the tool life was measured. When the processing length to the tool life was "12.0 m or more", such a case was rated as "A", "10.0 m or more and less than 12.0 m" was rated as "B", and "less than 10.0 m" was rated as "C". The measurement results are shown in Table 5.

TABLE 5

| | Cutting Test 1 | | Cutting Test 2 | |
|---|---|---|---|---|
| | Number of Corners Where Cracks Propagated to Other Corners | Evaluation | Processing Length (m) | Evaluation |
| Sample | | | | |
| Inventive Product 1 | 0 | A | 12.0 | A |
| Inventive Product 2 | 0 | A | 10.5 | B |
| Inventive Product 3 | 0 | A | 12.5 | A |
| Inventive Product 4 | 0 | A | 10.5 | B |
| Inventive Product 5 | 0 | A | 13.5 | A |
| Inventive Product 6 | 0 | A | 10.0 | B |
| Inventive Product 7 | 0 | A | 13.0 | A |
| Inventive Product 8 | 0 | A | 12.5 | A |
| Inventive Product 9 | 0 | A | 11.5 | B |
| Inventive Product 10 | 0 | A | 12.5 | A |
| Inventive Product 11 | 0 | A | 11.0 | B |
| Inventive Product 12 | 0 | A | 11.0 | B |
| Inventive Product 13 | 0 | A | 10.0 | B |
| Comparative Product 1 | 0 | A | 9.0 | C |
| Comparative Product 2 | 1 | B | 6.5 | C |
| Comparative Product 3 | 0 | A | 8.5 | C |
| Comparative Product 4 | 2 | C | 4.0 | C |
| Comparative Product 5 | 0 | A | 9.0 | C |
| Comparative Product 6 | 2 | C | 8.0 | C |
| Comparative Product 7 | 3 | C | 10.0 | B |
| Comparative Product 8 | 2 | C | 9.0 | C |
| Comparative Product 9 | 3 | C | 8.0 | C |

From the results shown in Table 5, in all the inventive products, the number of corners where cracks propagated to other corners upon fracture was "0", and the processing length to the tool life was 10.0 m or more. Meanwhile, in the comparative products 4 and 6 to 9, the number of corners where cracks propagated to other corners upon fracture was "2 or more", and, in the comparative products 1 to 6 and 8 to 9, the processing length to the tool life was less than 10.0 m. Thus, it can be seen that as compared with the comparative products, the inventive products are generally superior in fracture resistance.

From the above results, it turned out that the inventive products had excellent fracture resistance, and thus had longer tool life.

INDUSTRIAL APPLICABILITY

The coated cutting tool of the invention has excellent fracture resistance and thus allows for the extension of tool life than before, and is, from such a point of view, industrially applicable.

REFERENCE SIGNS LIST

1: Cemented carbide,
2: Compound layer,
3: Coating layer,
4: Coated cutting tool,
5: Gas introduction jig, 6: Gas blowout hole,
7: Jig on which a coated cutting tool is mounted,
8: Interval between a coated cutting tool and a jig,
9: Chemical vapor deposition apparatus,
10: Heater,
11: Reaction vessel,
12: Gas exhaust pipe.

The invention claimed is:

1. A coated cutting tool comprising a cemented carbide and a coating layer formed on the cemented carbide, the coated cutting tool being configured such that the coated cutting tool includes a rake face, a flank face, and a cutting edge line part located between the rake face and the flank face, the coating layer includes a compound layer containing a compound having a composition represented by the following formula (1):

$$(Al_xTi_{1-x})N \qquad (1)$$

(in formula (1), x represents the atomic ratio of elemental Al relative to the total of elemental Al and elemental Ti and satisfies $0.70 \leq x \leq 0.90$), when the average thickness of the coating layer in the cutting edge line part is expressed as $T_1$, and the average thickness of the coating layer in the rake face at a position 2 mm or more away from the cutting edge line part toward the rake face is expressed as $T_2$, $T_1$ is 4.0 μm or more and 10.0 μm or less, $T_2$ is 2.0 μm or more and 7.0 μm or less, and $T_2 < T_1$ is satisfied, and when the residual stress of the cemented carbide in the cutting edge line part is expressed as $S_1$, and the residual stress of the cemented carbide in the rake face at a position 2 mm or more away from the cutting edge line part toward the rake face is expressed as $S_2$, $S_2 < S_1$ is satisfied, and the residual stress $S_1$ is −0.5 GPa or more and 0.0 GPa or less, and the residual stress $S_2$ is −2.0 GPa or more and −0.3 GPa or less.

2. The coated cutting tool according to claim 1, wherein the difference $T_1 - T_2$ between the average thickness $T_1$ and the average thickness $T_2$ is 1.0 μm or more and 4.0 μm or less.

3. The coated cutting tool according to claim 1, wherein in the cemented carbide, the proportion of measurement points where tungsten carbide (WC) has a KAM value of 1° or less is 90% or more and 98% or less.

4. The coated cutting tool according to claim 1, wherein the cemented carbide is based on a WC phase, contains Co in a proportion of 5.0 mass % or more and 15.0 mass % or less, and contains Cr in a proportion of, as $Cr_3C_2$, 0.3 mass % or more and 1.0 mass % or less.

5. The coated cutting tool according to claim 1, wherein the coating layer includes, between the cemented carbide and the compound layer, a lower layer containing a Ti compound including elemental Ti and at least one element selected from the group consisting of C, N, O, and B.

* * * * *